United States Patent
Belady et al.

(10) Patent No.: US 9,585,291 B2
(45) Date of Patent: Feb. 28, 2017

(54) WATER CONDENSATE CAPTURE FROM DATACENTER POWER GENERATION

(75) Inventors: Christian L. Belady, Mercer Island, WA (US); Sean M. James, Olympia, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1258 days.

(21) Appl. No.: 13/527,580

(22) Filed: Jun. 19, 2012

(65) Prior Publication Data
US 2013/0333405 A1    Dec. 19, 2013

(51) Int. Cl.
| | | |
|---|---|---|
| G01K 13/00 | (2006.01) | |
| F25B 1/06 | (2006.01) | |
| B21D 39/03 | (2006.01) | |
| H05K 7/20 | (2006.01) | |
| F24F 13/22 | (2006.01) | |

(52) U.S. Cl.
CPC ....... H05K 7/20836 (2013.01); F24F 13/222 (2013.01); *Y02B 30/542* (2013.01); *Y10T 29/49826* (2015.01)

(58) Field of Classification Search
CPC . F24F 13/222; H05K 7/20836; Y02B 30/542; Y10T 29/49826
USPC ...................... 62/129, 291; 29/428
See application file for complete search history.

(56) References Cited

U.S. PATENT DOCUMENTS

| | | | | |
|---|---|---|---|---|
| 3,886,748 A * | 6/1975 | Bronicki | ................. | F01K 9/00 165/104.25 |
| 5,127,233 A * | 7/1992 | Coffield | ................. | A23L 3/3418 426/418 |
| 8,584,475 B2 * | 11/2013 | Scesney | ................. | B01D 5/0039 290/55 |
| 2004/0219415 A1 * | 11/2004 | Brignone | .......... | H01M 8/04007 429/434 |
| 2005/0125426 A1 * | 6/2005 | Minematsu | ........... | G06F 3/0605 |

(Continued)

OTHER PUBLICATIONS

Miller, Rich, "Absorption Chillers: Heat into Cooling", Retrieved at <<http://www.datacenterknowledge.com/inside-ibms-greenest-data-center/absorption-chillers-heat-into-cooling/>>, Dec. 8, 2009, p. 1.

(Continued)

*Primary Examiner* — Henry Crenshaw
(74) *Attorney, Agent, or Firm* — Henry Gabryjelski; Kate Drakos; Micky Minhas (57) ABSTRACT

Water condensate is captured from the exhaust of a generator utilized to provide power to a data center, and the captured water is then utilized for data center purposes such as adiabatic cooling. The exhaust of electrical power generators is passed through a condenser to obtain water condensate from such exhaust. The water condensate is stored in water storage units and is utilized to provide supplemental cooling to the data center. Sporadic usage of water can enable the water storage to be refilled between uses, since water condensate can be obtained from exhaust almost continuously. The level of water is monitored and the level of processing performed by the data center is adjusted to avoid emptying such water storage units. Historical climatological data is utilized to estimate the water required. Additionally, short and long-range weather forecasts can be optionally taken into account.

20 Claims, 3 Drawing Sheets

(56) References Cited

U.S. PATENT DOCUMENTS

| | | | |
|---|---|---|---|
| 2005/0208888 A1* | 9/2005 | Moore | F24F 11/053 454/334 |
| 2008/0057359 A1* | 3/2008 | Venkataraman | H01M 8/04089 429/423 |
| 2008/0166604 A1* | 7/2008 | Weingaertner | H01M 8/04992 429/430 |
| 2008/0302505 A1 | 12/2008 | Kato et al. | |
| 2009/0030554 A1* | 1/2009 | Bean, Jr. | F25B 49/02 700/276 |
| 2010/0071394 A1* | 3/2010 | Alden | F24F 5/0021 62/235.1 |
| 2010/0154448 A1* | 6/2010 | Hay | G06F 1/20 62/175 |
| 2010/0170272 A1* | 7/2010 | Deangelis | F24F 11/0086 62/157 |
| 2011/0096503 A1 | 4/2011 | Avery et al. | |
| 2011/0154842 A1 | 6/2011 | Heydari et al. | |
| 2011/0258248 A1* | 10/2011 | Jackson | H04L 67/1008 709/202 |

OTHER PUBLICATIONS

Nichols, Crystal, "New Data Center Power Sources", Retrieved at <<http://www.unitiv.com/it-solutions-blog/bid/69415/New-Data-Center-Power-Sources>>, Jul. 25, 2011, p. 1.

Miller, Rich, "Powering a Data Center with Methane", Retrieved at <<http://www.datacenterknowledge.com/archives/2009/02/19/powering-a-data-center-with-methane/>>, Feb. 19, 2009, pp. 2.

Sharma, et al., "Water Efficiency Management in Datacenters: Metrics and Methodology", Retrieved at <<http://www.hp.com/hpinfo/newsroom/press_kits/2011/HPFortCollins/Water_Efficiency_Paper.pdf>>, Proceedings of IEEE International Symposium on Sustainable Systems and Technology, May 18-20, 2009, pp. 1-6.

* cited by examiner

WATER CONDENSATE CAPTURE FROM DATACENTER POWER GENERATION

BACKGROUND

The throughput of communications, between multiple computing devices that are transmitted via network connections, continues to increase. Modern networking hardware enables physically separate computing devices to communicate with one another orders of magnitude faster than was possible with prior generations of networking hardware. Furthermore, high-speed network communication capabilities are being made available to a greater number of people, both in the locations where people work, and in their homes. As a result, an increasing amount of data and services can be meaningfully provided via such network communications. As a result, the utility of computing devices increasingly lies in their ability to communicate with one another. For example, users of computing devices traditionally used to utilize computing devices for content creation, such as the creation of textual documents or graphical images. Increasingly, however, the most popular utilizations of computing devices are in the browsing of information sourced from other computing devices, the interaction with other users of other computing devices, the utilization of the processing capabilities of other computing devices and the like.

In particular, it has become more practical to perform digital data processing at a location remote from the location where such data is initially generated, and where the processed data will be consumed. For example, a user can upload a digital photograph to a server and then cause the server to process the digital photograph, changing its colors and applying other visual edits to it. In such an example, of the digital processing that is being performed is being performed by a device that is remote from the user. Indeed, in such an example, if the user was utilizing a battery-operated computing device to interact with the server such as, for example, a laptop or smartphone, the user could be in a location that was not receiving any electrical power at all. Instead, electrical power can have been delivered to the server, which is remote from the user, and the server can have utilized electrical power to process the data provided by the user and then return the processed data to the user. In such an example, the user was able to perform processing on digital data without receiving any electrical power and instead, receiving, only the result of the work performed by electrical power, namely the processed data that was performed by the server computing device that has consumed electrical power that was delivered to the location where the server was located.

To provide such data and processing capabilities, via network communications, from a centralized location, the centralized location typically comprises hundreds or thousands of computing devices, typically mounted in vertically oriented racks. Such a collection of computing devices, as well as the associated hardware necessary to support such computing devices, and the physical structure that houses the computing devices and associated hardware, is traditionally referred to as a "data center". With the increasing availability of high-speed network communication capabilities, and thus the increasing provision of data and services from centralized locations, as well as the traditional utilization of data centers, such as the provision of advanced computing services and massive amounts of computing processing capability, the size and quantity of datacenters continues to increase.

However, data centers often consume large quantities of electrical power, especially by the computing devices themselves. Increasingly, the cost of obtaining such electrical power is becoming a primary determinant in the economic success of a data center. Consequently, data centers are being located in areas where the data centers can obtain electrical power in a cost-effective manner. In some instances, data centers are being located in areas that can provide inexpensive electrical power directly, such as areas in which electricity can be purchased from electrical utilities or governmental electrical facilities inexpensively. In other instances, however, data centers are being located in areas where natural resources, from which electrical power can be derived, are abundant and can be obtained inexpensively. For example, natural gas is a byproduct of oil drilling operations and is often considered a waste byproduct since it cannot be economically captured and brought to market. Consequently, in areas where oil drilling operations are being conducted, natural gas is often available for free, or at a minimal cost. As will be recognized by those skilled in the art, natural gas can be utilized to generate electrical power, such as, for example, through a fuel cell or by generating steam to drive a steam powered electrical generator. Unfortunately, areas where natural resources from which electrical power can be derived are abundant are often areas where water is a scarce and expensive resource. As will also be recognized by those skilled in the art, water is utilized in the cooling of data centers, such as through adiabatic coolers. Consequently, the increased cost of water can offset the efficiencies gained by locating a data center in an area having an abundance of natural resources from which electrical power can be derived.

SUMMARY

In one embodiment, water can be obtained from the exhaust of an electrical power generator that generates electrical power for a data center by consuming a fuel that can be obtained inexpensively at the location of the data center. In such a manner, two resources, namely power and water, can be derived from only one resource, namely the fuel consumed by the power generator. One such electrical power generator can be a natural-gas-powered fuel cell whose exhaust includes water vapor. Other electrical power generators can be based on the combustion of hydrocarbons, whose exhaust also includes water vapor. The exhaust of such electrical power generators can be passed through a condenser unit or system to obtain water condensate from such exhaust, which can then be utilized in the data center.

In another embodiment, the water condensate obtained from the exhaust of an electrical generator can be stored in water storage units and can be utilized to provide cooling to the data center. Such cooling can be supplemental to other cooling mechanisms utilized by the data center, such that water-based cooling is utilized sporadically. While the amount of water utilized to cool the data center may be in a greater volume per unit of time than the water being obtained from the exhaust of the electrical generator, the sporadic usage of such water can enable the water storage to be refilled, since water condensate can be obtained from the exhaust of the electrical generator almost continuously.

In yet another embodiment, processes executing on one or more of the computing devices on the data center can monitor the level of water in water storage units and can adjust the processing being performed by the data center to avoid emptying such water storage units. Processes being executed by the data center can be prioritized and certain processes can be identified for offloading to other data centers should it be determined that the amount of water available will be insufficient to cool the data center if the data center maintained a current level of processing. Historical climatological data can be utilized to estimate the amount of water that will be required in the future to cool the data center, and historical water condensate capture amounts can be utilized to estimate the amount of water that will be added to the water storage units over time.

In a further embodiment, short and long-range weather forecasts can be taken into account in estimating water utilization for cooling and water condensate capture amounts in order to more accurately gauge whether processing performed by the data center should be offloaded to other data centers to avoid using up all of the water.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

The following description relates to the capturing of water condensate from the exhaust of a generator that is utilized to provide power to a data center, and then utilizing the captured water for data center purposes such as adiabatic cooling. A generator can generate electrical power for a data center by consuming a fuel that can be obtained inexpensively at the location of the data center, such as natural gas, hydrocarbons, hydrogen, and other like fuels. The exhaust of such electrical power generators can be passed through a condenser unit or system to obtain water condensate from such exhaust. The water condensate obtained can be stored in water storage units and can be utilized to provide cooling to the data center. Such cooling can be supplemental to other cooling mechanisms utilized by the data center, such that water-based cooling is utilized sporadically. While the amount of water utilized to cool the data center may be in a greater volume per unit of time than the water being obtained from the exhaust of the electrical generator, the sporadic usage of such water can enable the water storage to be refilled, since water condensate can be obtained from the exhaust of the electrical generator almost continuously. The level of water in water storage units can be monitored by the data center and the data center can adjust the level of processing it is performing to avoid emptying such water storage units. Processes being executed by the data center can be prioritized and certain processes can be identified for offloading to other data centers should it be determined that the amount of water available will be insufficient to cool the data center if the data center maintained a current level of processing. Historical climatological data can be utilized to estimate the amount of water that will be required in the future to cool the data center, and historical water condensate capture amounts can be utilized to estimate the amount of water that will be added to the water storage units over time. Additionally, short and long-range weather forecasts can be optionally taken into account in estimating water utilization for cooling and water condensate capture amounts in order to more accurately gauge whether processing performed by the data center should be offloaded to other data centers to avoid using up all of the water.

The techniques described herein make reference to specific types of generators and specific types of utilizations of water. For example, reference is made to natural-gas-powered generators, such as a fuel cell. Similarly, reference is made to specific utilizations of water, such as for adiabatic cooling. Such references, however, are strictly exemplary and are made for ease of description and presentation, and are not intended to limit the mechanisms described to specific generators and utilizations of water enumerated. Instead, the techniques described herein are equally applicable, without modification, to the obtaining of water condensate from the exhaust of any process, whether electrical generating or not, whose exhaust includes water vapor. Additionally, the techniques described herein are equally applicable, without modification, to other utilization of exhaust condensate captured water, including the provision of potable water to humans, and the sale of water to third parties to offset other costs.

Although not required, aspects of the descriptions below will be provided in the general context of computer-executable instructions, such as program modules, being executed by a computing device. More specifically, aspects of the descriptions will reference acts and symbolic representations of operations that are performed by one or more computing devices or peripherals, unless indicated otherwise. As such, it will be understood that such acts and operations, which are at times referred to as being computer-executed, include the manipulation by a processing unit of electrical signals representing data in a structured form. This manipulation transforms the data or maintains it at locations in memory, which reconfigures or otherwise alters the operation of the computing device or peripherals in a manner well understood by those skilled in the art. The data structures where data is maintained are physical locations that have particular properties defined by the format of the data.

Generally, program modules include routines, programs, objects, components, data structures, and the like that perform particular tasks or implement particular abstract data types. Moreover, those skilled in the art will appreciate that the computing devices need not be limited to conventional server computing racks or conventional personal computers, and include other computing configurations, including handheld devices, multi-processor systems, microprocessor based or programmable consumer electronics, network PCs, minicomputers, mainframe computers, and the like. Similarly, the computing devices need not be limited to a stand-alone computing device, as the mechanisms may also be practiced in distributed computing environments linked through a communications network. In a distributed computing environment, program modules may be located in both local and remote memory storage devices.

Figure 1:
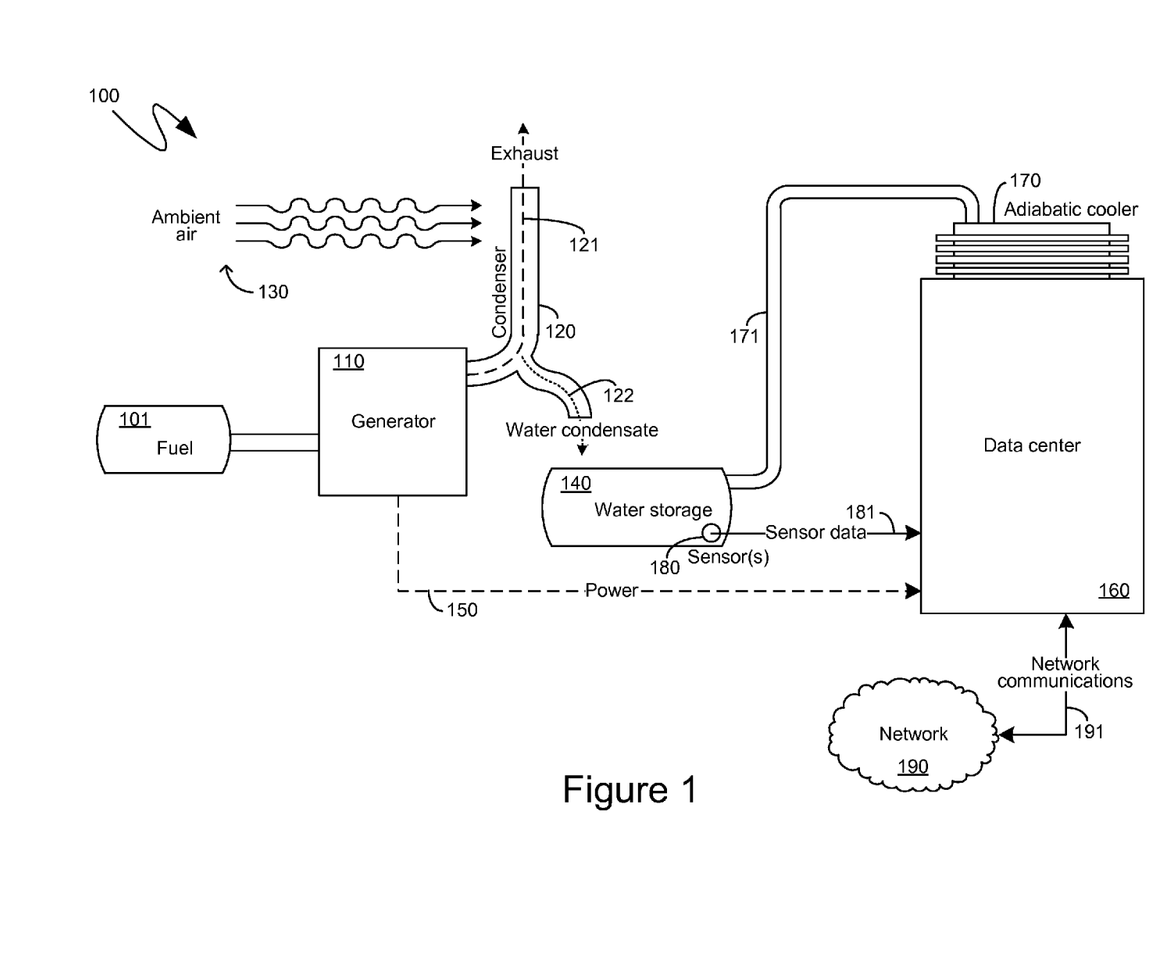
FIG. 1 is a component diagram of an exemplary system for capturing water condensate from the exhaust of a generator, which is being utilized to provide power to a data center, and utilizing the captured water to cool the data center.

With reference to FIG. 1, an exemplary system 100 is illustrated for capturing water condensate from a generator. For example, exemplary system 100 can be located in an area where the fuel 101 is plentiful or is otherwise available at a minimal cost. Such a fuel can include natural gas, methane, propane or other hydrocarbons, hydrogen, or any other fuel that can be accepted as input into a generator 110 that can generate power 150 for the data center 160. Typically, as will be recognized by those skilled in the art, the power 150 provided to the data center 160 can be electrical power, although the mechanisms described herein are not limited by the type of power that is generated by the generator 110.

In one common example, the fuel 101 can be natural gas that can be provided to a fuel cell, which can act as the generator 110. In such an exemplary embodiment, the fuel cell, acting as the generator 110 can generate the power 150 in the form of direct current electrical power from a fuel 101, namely natural gas. More specifically, and as will be understood by those skilled in the art, a fuel cell, such as a gas solid oxide fuel cell, can comprise an electrolyte, typically in the form of a solid ceramic material, and an anode and cathode on opposite sides of the electrolyte, each typically comprised of an ink coating on the electrolyte. Such a fuel cell can accept natural gas as an input and, inside of the fuel cell, the natural gas can be mixed with water steam to form a "reformed fuel". This reformed fuel can then enter the anode side of the electrolyte and, as it crosses the anode, it can attract oxygen ions from the cathode, which are attracted into the cathode from the hot air that is fed to the fuel cell. The oxygen ions combine with the reformed fuel in the electrolyte to produce electricity, water, and small amounts of carbon dioxide, as well as heat.

The exhaust 121 of such a generator, therefore, includes water vapor. Other types of generators equally include water vapor. For example, as will be known by those skilled in the art, the combustion of hydrocarbons generates water vapor, carbon dioxide and other by-products. The combustion of hydrocarbons can also generate electricity, such as, for example, by driving a motor rotating an electric coil in a magnetic field, or heating water to generate water vapor to drive steam-powered generators.

In one embodiment, a condenser 120 can be connected to the generator 110 and the exhaust 121 of the generator 110 can then be passed through the condenser 120 and then exhausted into the air. The condenser 120 can be designed to be of sufficient length to cool the exhaust 121 to a temperature approaching the ambient temperature of the air 130. The dew point of the heated exhaust 121 can be higher than the ambient temperature of the air 130. Consequently, when the condenser 120 cools the exhaust 121 to a temperature approaching the ambient temperature of the air 130, the water vapor present in the exhaust 121 can condense out as water condensate 122. The water condensate 122 can be collected by the condenser 120 and directed to one or more water storage units, such as the water storage unit 140.

In one embodiment, the condenser 120 can be exposed to the air 130 such that air movement across the condenser 120 can enable a heat exchange between the hot exhaust 121 being exhausted through the condenser 120 and the air 130 whose ambient temperature can be lower than the temperature of the exhaust 121. Consequently, the condenser 120 can be constructed of a metal, such as copper, or other like substance that can facilitate the transfer of heat from the exhaust 121 to the air 130, thereby cooling the exhaust 121 below the dew point of the exhaust 121, thereby enabling the water vapor present in the exhaust 121 to condense out of the exhaust 121 as the water condensate 122. Additionally, to facilitate the exchange of heat between the exhaust 121 and the air 130, the condenser 120 can be of sufficient length such that, as the exhaust 121 travels through the condenser, there is sufficient time for the transfer of heat from the exhaust 121 through the condenser 120 to the air 130. Nevertheless, the condenser 120 can be designed and oriented such that the exhaust 121 is exhausted to the air 130 in an efficient manner and does not introduce health concerns by improperly exhausting of the exhaust 121 that is produced by the generator 110. As one example, such as is illustrated in FIG. 1, the condenser 120 can be oriented in a primarily vertical orientation to ease the passage of the exhaust 121 from the generator 110 to the air 130.

As indicated, by cooling the exhaust 121 below its dew point, the condenser 120 can cause water vapor present in the exhaust 121 to condense out as the water condensate 122. Typically, as will be recognized by those skilled in the art, the liquid water condensate 122 that is condensed out of the gaseous exhaust 121 will travel down the condenser 120 to a low point at which the water will collect. Consequently, in one embodiment, the condenser 120 can include a pipe or other connector that can direct the water condensate 122, in the form of the water collected at such a low point, from that low point to one or more water storage units, such as the water storage unit 140, such as is illustrated in FIG. 1. Such a connector can be constructed of a material along which water can flow efficiently and not be contaminated such as, for example, metals such as copper, or plastics such as PVC.

Once collected in water storage units, such as the water storage unit 140, the water can be utilized for various purposes within the data center. As will be recognized by those skilled in the art, the water condensate 122 can include potable water. Consequently, one purpose for which the water collected in the water storage unit 140 can be utilized is to simply provide drinking water, either to employees of the data center 160, or to sell such water to offset other costs. Another purpose for which the water collected in the water storage unit 140 can be utilized can be to provide the water necessary for various aspects of the generator 110, such as the water vapor utilized in a fuel cell.

In one embodiment, the water collected in the water storage unit 140 can be utilized to provide adiabatic cooling of the data center 160. Thus, as shown in the exemplary system 100 of FIG. 1, a pipe or other connector 171 can provide water from the water storage unit 140 to an adiabatic cooler 170 that can provide cooling to the data center 160. As will be recognized by those skilled in the art, adiabatic cooling utilizes the heat-absorbing capabilities of the conversion of liquid water to water vapor to absorb the heat generated by, for example, the computing devices in the data center 160, thereby cooling the data center 160. While adiabatic cooling can be utilized continuously, in one embodiment, the computing devices of the data center 160 can operate by being cooled only by the air 130 so long as the ambient temperature of the air 130 is not above a threshold level that may be exceeded only rarely. For example, modern computing devices can be cooled effectively only through air movement so long as the ambient temperature of the air 130 is below 90 to 95 degrees Fahrenheit. Consequently, in such an embodiment, the adiabatic cooler 170 can be operated only when the ambient temperature of the air 130 exceeds, for example, 95 degrees Fahrenheit, or another like threshold temperature beyond which the server computing devices of the data center 160 can no longer be cooled effectively only through air movement.

As will be recognized by those skilled in the art, if the location of the data center 160 is selected properly, there may be only a few days out of the year where the ambient temperature of the air 130 will exceed the threshold temperature beyond which the server computing devices of the data center 160 can no longer be cooled effectively only through air movement. Additionally, even on those days where the ambient temperature of the air 130 exceeds such a threshold temperature, it is likely to do so only for a few hours out of the day such as, for example, the mid-afternoon hours. Thus, in such an embodiment, the adiabatic cooler 170 may utilize water from the water storage unit 140 only for a few hours a day for only a handful of days out of the entire year.

If the generator 110 is operated continuously to provide the power 150 to the data center 160, then the water storage unit 140 can continuously receive the water condensate 122 from the condenser 120. Thus, even if the amount of water condensate 122 being received is nothing more than a "trickle", or a small volume of water for any given time, the water storage unit 140 can still collect an adequate amount of water given that the water condensate 122 is being continuously delivered to the water storage unit 140. To provide an illustrative, but not necessarily empirical, example, the condenser 120 can deliver approximately 1 gallon of water condensate 122 to the water storage unit 140 for each twenty-four hours that the generator 110 is in operation. Consequently, in such an illustrative example, over the course of a year, the water storage unit 140 can receive approximately 365 gallons of water. Continuing with such an illustrative example, the adiabatic cooler 170 can utilize ten gallons of water per hour to provide adiabatic cooling to the data center 160. Consequently, so long as the ambient temperature of the air 130 does not exceed the threshold temperature at which the adiabatic cooler 170 is to be engaged for more than approximately 36 hours each year, the condenser 120 will generate enough water for the data center 160 to maintain continuous operation and not require any external water source, nor any delivery of external water. Utilizing different terms, if the ambient temperature of the air 130 exceeds the threshold temperature at which the adiabatic cooler 170 is to be engaged for only 3 to 5 hours a day on the hottest days, then so long as there are less than 7 to 10 such days in a year, the condenser 120 will generate enough water for the data center 160 to maintain continuous operation and not require any external water source, nor any delivery of external water.

By avoiding the need for external water, the system 100 of FIG. 1 can be located in locations where the fuel 101 is readily available or can be inexpensively obtained. For example, as indicated previously, natural gas is often a byproduct of oil drilling operations. Consequently, since a data center 160 could be located near an oil drilling operation, the fuel 101, in the form of natural gas, could be provided essentially for free. However, as will be recognized by those skilled in the art, oil drilling operations are often located in remote areas, including desert areas, where water is a scarce resource. Utilizing the exemplary system 100 as shown in FIG. 1 and described in detail herein, a data center 160 could be located to take advantage of such free natural gas, without requiring any additional infrastructure for delivering water to such a data center. In such a manner, the data center 160 can operate in a more cost-effective manner.

To enable external computing devices to take advantage of the processing capabilities of the computing devices in the data center 160, the data center 160 can be communicationally coupled to a network 190, such as via network communications 191. As will be recognized by those skilled in the art, the network communications 191 typically comprise fiber optic communications, but can also include any other forms of wired or wireless communications.

In one embodiment, one or more sensors, such as the sensor 180 can monitor the amount of water in the water storage unit 140 and can provide such sensor data 181 to one or more computing devices in the data center 160. The computing devices receiving the sensor data 181 can execute processes that can monitor the level of the water in the water storage units, such as the water storage unit 140, to ensure that the data center 160 has sufficient water, such as for cooling purposes. In one embodiment, should such processes determine that there is insufficient water, some of the processing performed by the computing devices of the data center 160 can be offloaded to other data centers that are also communicationally coupled to the network 190, such as via the network communications 191. Having offloaded such processing, the data center 160 can, thereby, perform less processing, resulting in less heat generation by the processing circuitry of the computing devices of the data center 160, and reducing the need for cooling, thereby conserving water that would otherwise be utilized to cool the data center 160.

Figure 2:
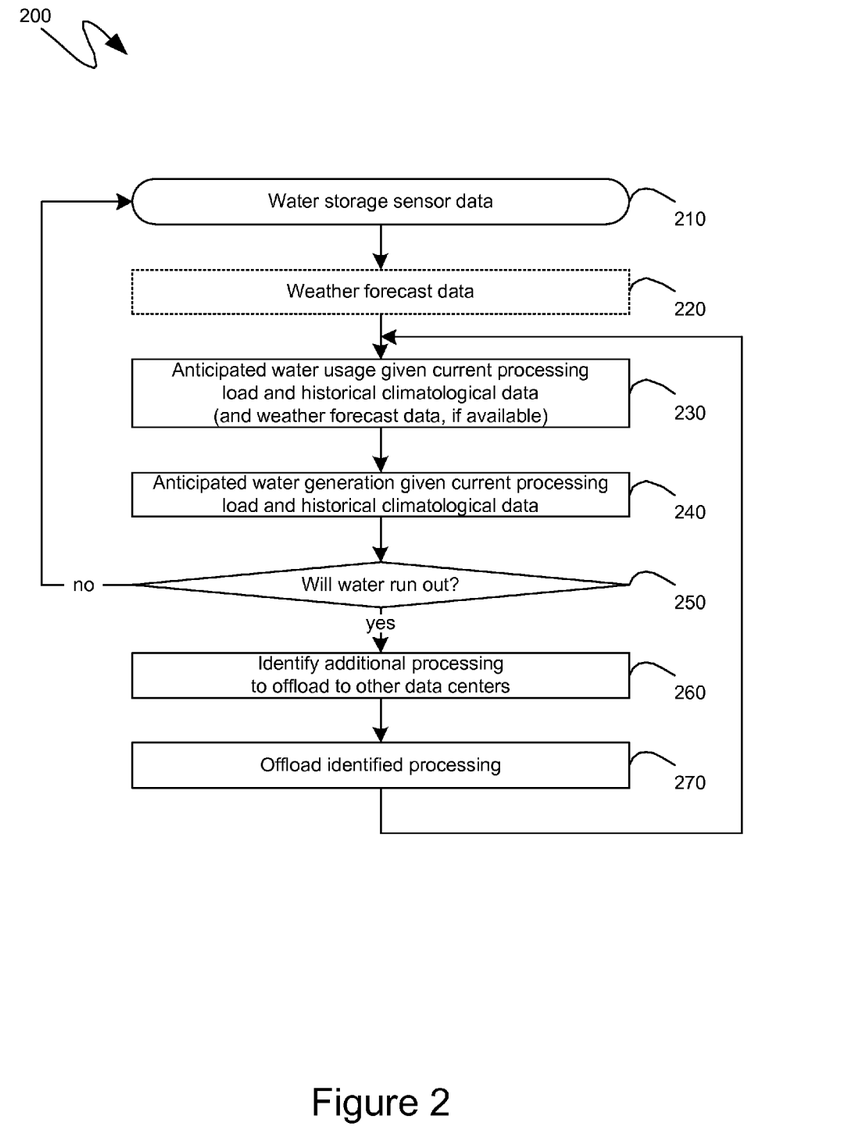
FIG. 2 is a flow diagram of an exemplary offloading of processing to avoid running out of water.

Turning to FIG. 2, the flow diagram 200 shown therein illustrates an exemplary series of steps that can be performed by processes executed by one or more of the computing devices of the data center 160, or by remote computing devices, whereby the level of water in water storage units can be monitored and appropriate actions can be taken to avoid exhausting such water. Initially, as illustrated by step 210, sensor data from one or more of the sensors of the water storage units can be received, thereby indicating the level of water remaining in the water storage units. In another embodiment, the water stored sensor data received at step 210 can comprise other information such as, for example, the rate at which the water is being depleted, or increased, the temperature of the water, the purity of the water, or other like data.

In one embodiment, as an optional step, thereby indicated via dashed lines in the flow diagram 200 of FIG. 2, weather forecast data can be received at step 220 and utilized in the subsequent processing. Such weather forecast data can include both the short-term forecasts that provide specific temperature ranges for specific days, and long-term forecasts that provide temperature trends for more generically defined periods of time. Subsequently, at step 230, the anticipated water usage can be estimated given the current processing being performed by the data center and given the historical climatological data of the region where the data center is located. For example, if the historical climatological data indicates that a hot season has ended and that the chances for daytime high temperatures that exceed a threshold temperature at which adiabatic cooling is to be initiated decrease over the next several months, than the anticipated water usage determined at step 230 can be negligible. As another example, if the historical climatological data indicates that a hot season will typically last for several more weeks, and recent historical climatological data indicates that the current hot season has been above average, the anticipated water usage determined at step 230 can be greater than it would typically be. If short- or long-term forecast data was received at step 220, then such forecast data can be taken into account in anticipating the water usage at step 230. Thus, for example, even if recent historical climatological data indicates that the current hot season has been above average, if long-term forecast data received at step 220 predicts cooler than normal whether for the next several weeks, the anticipated water usage can be reduced accordingly at step 230.

At step 240, an estimate can be made of the amount of water that will be added to the water storage units, such as through the condenser system described in detail above. As will be recognized by those skilled in the art, the ambient temperature of the air can affect the amount of cooling that the exhaust gases of a generator can be subject to, thereby affecting the ability of the condenser system to reduce the temperature of such exhaust gases below their dew point and generate water condensate. Thus, for example, if the historical climatological data indicates that temperatures will decrease going forward, than the anticipated water generation at step 240 can estimate a greater amount of water being generated then if the historical climatological data indicated that temperatures will increase going forward. Similarly, if short- or long-term forecast data was received, such as at step 220, that too can be taken into account at step 240. Thus, if the short term forecast data indicated that a cold front would drop temperatures for the next several days, the anticipated water generation at step 240 can estimate a greater amount of water being generated than it would otherwise have estimated.

At step 250, based on the anticipated water usage determined at step 230 and the anticipated water generation determined at step 240, a determination can be made as to whether the data center will run out of water. If it is determined, at step 250, that the data center will not run out of water, processing can return to step 210 and the water stored sensor data can continue to be received and monitored, such as in the manner described in detail above. Conversely, if it is determined, at step 250, that the data center may run out of water, processing can proceed to step 260 at which point processing currently being performed by the data center can be prioritized and, based on such a priority, processing can be identified to be offloaded to other data centers. For example, processing priority can be based on the customer whose processes are being executed, the amount of resources that the execution of such processes consumes, the real-time or urgent nature of the processes, and other like criteria. Processes to be offloaded can, in one embodiment, be those processes having lower priorities. In another embodiment, however, the processes to be offloaded can be those processes having higher priorities since, for example, there may be a more substantial impact should such processes suddenly cease if the data center ran out of water and overheated.

At step 270, the processes identified at step 260 can be offloaded to other data centers and the current data center can stop executing such processes. Processing can then return to step 230, and steps 230, 240 and 250 can be repeated taking into account the new, reduced processing being performed by the data center, which should decrease the anticipated water usage at step 230. If, at step 250, it is still determined that the water will run out, additional processing to offload can be identified at step 260, as described in detail above. Conversely, if, at step 250, it is now determined that the water will not run out, then processing can proceed to step 210, as described previously.

Figure 3:
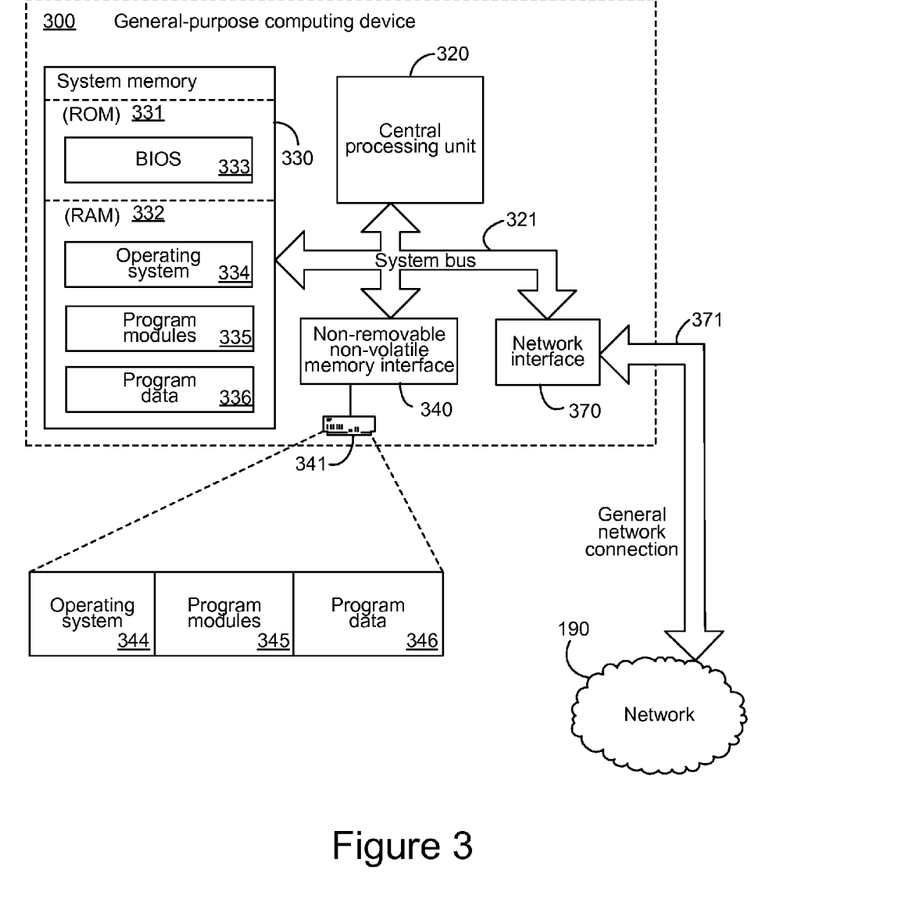
FIG. 3 is a block diagram illustrating an exemplary general purpose computing device.

The steps of the flow diagram 200 of FIG. 2 can be performed by one or more of the computing devices of the data center, or can be performed by one or more computing devices that are remote from the data center. Turning to FIG. 3, an exemplary general-purpose computing device, such as one of the one or more computing devices that can perform the steps of the flow diagram of FIG. 2, is illustrated in the form of the exemplary general-purpose computing device 300. The exemplary general-purpose computing device 300 can include, but is not limited to, one or more central processing units (CPUs) 320, a system memory 330 and a system bus 321 that couples various system components including the system memory to the processing unit 320. The system bus 321 may be any of several types of bus structures including a memory bus or memory controller, a peripheral bus, and a local bus using any of a variety of bus architectures. Depending on the specific physical implementation, one or more of the CPUs 320, the system memory 330 and other components of the general-purpose computing device 300 can be physically co-located, such as on a single chip. In such a case, some or all of the system bus 321 can be nothing more than communicational pathways within a single chip structure and its illustration in FIG. 3 can be nothing more than notational convenience for the purpose of illustration.

The general-purpose computing device 300 also typically includes computer readable media, which can include any available media that can be accessed by computing device 300. By way of example, and not limitation, computer readable media may comprise computer storage media and communication media. Computer storage media includes media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the general-purpose computing device 300. Communication media typically embodies computer readable instructions, data structures, program modules or other data in a modulated data signal such as a carrier wave or other transport mechanism and includes any information delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

When using communication media, the general-purpose computing device 300 may operate in a networked environment via logical connections to one or more remote computers. The logical connection depicted in FIG. 3 is a general network connection 371 to the network 190, which can be a local area network (LAN), a wide area network (WAN) such as the Internet, or other networks. The computing device 300 is connected to the general network connection 371 through a network interface or adapter 370 that is, in turn, connected to the system bus 321. In a networked environment, program modules depicted relative to the general-purpose computing device 300, or portions or peripherals thereof, may be stored in the memory of one or more other computing devices that are communicatively coupled to the general-purpose computing device 300 through the general network connection 371. It will be appreciated that the network connections shown are exemplary and other means of establishing a communications link between computing devices may be used.

The general-purpose computing device 300 may also include other removable/non-removable, volatile/nonvolatile computer storage media. By way of example only, FIG. 3 illustrates a hard disk drive 341 that reads from or writes to non-removable, nonvolatile media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and the like. The hard disk drive 341 is typically connected to the system bus 321 through a non-removable memory interface such as interface 340.

The drives and their associated computer storage media discussed above and illustrated in FIG. 3, provide storage of computer readable instructions, data structures, program modules and other data for the general-purpose computing device 300. In FIG. 3, for example, hard disk drive 341 is illustrated as storing operating system 344, other program modules 345, and program data 346. Note that these components can either be the same as or different from operating system 334, other program modules 335 and program data 336. Operating system 344, other program modules 345 and program data 346 are given different numbers here to illustrate that, at a minimum, they are different copies.

As can be seen from the above descriptions, the capture of water condensate from exhaust gas, and the use thereof, has been presented. Which, in view of the many possible variations of the subject matter described herein, we claim as our invention all such embodiments as may come within the scope of the following claims and equivalents thereto.

We claim:

1. A system for capturing water condensate from generator exhaust, the system comprising:
   a data center comprising multiple computing devices;
   a generator consuming a fuel and providing power to the data center;
   a condenser comprising:
      vertically oriented piping, at least a portion of which is exposed to surrounding air; and
      a spout positioned at a lower portion of the vertically oriented piping;
      wherein the condenser is coupled to the generator such that exhaust from the generator is directed through the vertically oriented piping of the condenser; and
      wherein further the condenser facilitates heat transfer from the exhaust to the surrounding air, thereby condensing water from the exhaust;
   a water storage coupled to the spout of the condenser, thereby receiving the condensed water therefrom; and
   a water conservation computing device comprising one or more computer-readable media and one or more processing units, the one or more computer-readable media comprising computer-executable instructions, which, when executed by the one or more processing units, cause the water conservation computing device to:
      determine an anticipated water usage of the data center for a first period of time given a current processing being performed by the data center;
      determine an anticipated water generation for the first period of time from the condenser given the current processing being performed by the data center;
      select processing for offloading from the data center to one or more different data centers external to the system;
      determine an updated anticipated water usage of the data center for the first period of time given an updated quantity of processing that would be performed by the data center if the selected processing was offloaded;
      determine an updated water generation for the first period of time from the condenser given the updated quantity of processing that would be performed by the data center if the selected processing was offloaded;
      repeat the selecting, the determining the updated anticipated water usage and the determining the updated anticipated water generation until the until the updated anticipated water usage for the first period of time is less than the current amount of water remaining in combination with the updated anticipated water generation for the first period of time; and
      offload the selecting processing.

2. The system of claim 1, further comprising an adiabatic cooler receiving water from the water storage and cooling the data center; wherein the anticipated water usage of the data center comprises anticipated water usage of the adiabatic cooler to cool the data center given a quantity of processing being performed by the data center.

3. The system of claim 2, wherein the adiabatic cooler is only sporadically utilized and is supplemental to other cooling mechanisms utilized to cool the computing devices of the data center.

4. The system of claim 2, wherein the water storage receives more condensed water while adiabatic cooler is not operational than the adiabatic cooler consumes while it is operational.

5. The system of claim 4, wherein the adiabatic cooler is operational for only a few hours a day during each of only a few days a year.

6. The system of claim 1, wherein the water storage comprises sensors monitoring a level of water; and wherein further the sensors are communicationally coupled to the water conservation computing device and provide water level data to the water conservation computing device.

7. The system of claim 1, wherein the generator is a primary power source for the data center such that it is continuously operational and generating the exhaust while the data center is operational.

8. The system of claim 1, wherein the fuel consumed by the generator is a waste product generated proximate to the system.

9. The system of claim 1, wherein the generator is a fuel cell.

10. One or more computer-readable media comprising computer-executable instructions for conserving water at a data center by offloading processing from the data center to one or more different data centers, the computer-executable instructions, when executed by one or more processing units of a computing device, cause the computing device to:
    determine an anticipated water usage for adiabatically cooling the data center for a first period of time given a current processing being performed by the data center;
    determine an anticipated water generation for the first period of time from water condensed from exhaust of a generator providing power to the data center;
    receive sensor data indicative of a current amount of water remaining;
    select processing for offloading from the data center to the one or more different data centers;
    determine an updated anticipated water usage for adiabatically cooling the data center for the first period of time given an updated quantity of processing that would be performed by the data center if the selected processing was offloaded;

determine an updated anticipated water generation for the first period of time from water condensed from the exhaust of the generator providing power to the data center given the updated quantity of processing that would be performed by the data center if the selected processing was offloaded repeat the selecting, the determining the updated anticipated water usage and the determining the updated anticipated water generation until the updated anticipated water usage for the first period of time is less than the current amount of water remaining in combination with the updated anticipated water generation for the first period of time; and offload the selecting processing.

11. The computer-readable media of claim 10, further comprising computer-executable instructions for prioritizing processes currently being performed by the data center; wherein the computer-executable instructions for offloading processing comprise computer-executable instructions for offloading specific processes based on the prioritization.

12. The computer-readable media of claim 10, wherein the computer-executable instructions for determining the anticipated water usage comprise computer-executable instructions for determining the anticipated water usage based on historical climatological data for a location of the data center.

13. The computer-readable media of claim 10, wherein the computer-executable instructions for determining the anticipated water usage comprise computer-executable instructions for determining the anticipated water usage based on weather forecast data for the location of the data center.

14. The computer-readable media of claim 10, wherein the computer-executable instructions for determining the anticipated water generation comprise computer-executable instructions for determining the anticipated water generation based on historical climatological data for a location of the data center.

15. A method for conserving water at a data center by offloading processing from the data center to one or more different data centers, the method comprising:

determining an anticipated water usage for adiabatically cooling the data center for a first period of time given a current processing being performed by the data center;

determining an anticipated water generation for the first period of time from water condensed from exhaust of a generator providing power to the data center;

receiving sensor data indicative of a current amount of water remaining;

selecting processing for offloading from the data center to the one or more different data centers;

determining an updated anticipated water usage for adiabatically cooling the data center for the first period of time given an updated quantity of processing that would be performed by the data center if the selected processing was offloaded;

determining an updated anticipated water generation for the first period of time from water condensed from the exhaust of the generator providing power to the data center given the updated quantity of processing that would be performed by the data center if the selected processing was offloaded repeating the selecting, the determining the updated anticipated water usage and the determining the updated anticipated water generation until the updated anticipated water usage for the first period of time is less than the current amount of water remaining in combination with the updated anticipated water generation for the first period of time; and offloading the selecting processing.

16. The method of claim 15, further comprising prioritizing processes comprising the current processing being performed by the data center; wherein the offloading processing comprises offloading specific processes based on the prioritization.

17. The method of claim 15, wherein the determining the anticipated water usage comprises determining the anticipated water usage based on historical climatological data for a location of the data center.

18. The method of claim 15, wherein the determining the anticipated water usage comprises determining the anticipated water usage based on weather forecast data for the location of the data center.

19. The method of claim 15, wherein the determining the anticipated water generation comprises determining the anticipated water generation based on historical climatological data for a location of the data center.

20. The system of claim 1, wherein one or more of the multiple computing devices of the data center are the water conservation computing device.

* * * * *